US007915917B2

(12) United States Patent
Lee et al.

(10) Patent No.: US 7,915,917 B2
(45) Date of Patent: Mar. 29, 2011

(54) INTEGRATED CIRCUIT WITH IMPROVED LOGIC CELLS

(75) Inventors: Fung Fung Lee, Beijing (CN); Wen Zhou, Beijing (CN)

(73) Assignee: Agate Logic (Beijing), Inc., Beijing (CN)

( * ) Notice: Subject to any disclaimer, the term of this patent is extended or adjusted under 35 U.S.C. 154(b) by 0 days.

(21) Appl. No.: 12/753,623

(22) Filed: Apr. 2, 2010

(65) Prior Publication Data

US 2010/0219861 A1    Sep. 2, 2010

Related U.S. Application Data

(62) Division of application No. 12/469,348, filed on May 20, 2009, now Pat. No. 7,719,311.

(51) Int. Cl.
*H03K 19/177* (2006.01)
*H03K 19/173* (2006.01)

(52) U.S. Cl. ............... 326/40; 326/41; 326/47

(58) Field of Classification Search ............ 326/38–41, 326/47
See application file for complete search history.

(56) References Cited

U.S. PATENT DOCUMENTS
2005/0218929 A1* 10/2005 Wang et al. ............. 326/41
* cited by examiner

*Primary Examiner* — Daniel D Chang
(74) *Attorney, Agent, or Firm* — James Wu; JW Law Group

(57) ABSTRACT

The present invention provides integrated circuits with improved logic cells. In one embodiment, an integrated circuit having a plurality of logic cells (LC) is provided, each LC comprising: a lookup table having a LUT output terminal; and, a first multiplexer; wherein, a first multiplexer input terminal is connected to of a first input terminal of the LC, a second multiplexer input terminal is connected to the LUT output terminal, a multiplexer output terminal is connected to a first output terminal of the LC, and a multiplexer select terminal is connected to a second input terminal of the LC so as to select which of the signals appearing at the first and second multiplexer input terminal to pass through; wherein, by coupling in chain the first input terminal of one LC to the first output terminal of another LC, a WLUT chain is formed.

9 Claims, 16 Drawing Sheets

US 7,915,917 B2

INTEGRATED CIRCUIT WITH IMPROVED LOGIC CELLS

RIGHT OF PRIORITY OF PCT APPLICATION

The present application is a divisional application of U.S. patent application Ser. No. 12/469,348, entitled "Integrated Circuit With Improved Logic Cells," filed on May 20, 2009, in the name of inventors Fung Fung Lee, Wen Zhou, which, in turn, claims the benefit of priority based on PCT Patent Application Ser. No. PCT/CN2008/000227, entitled "An Integrated Circuit With Improved Logic Cells," filed on Jan. 30, 2008, in the name of inventors Fung Fung Lee, Wen Zhou, all commonly owned herewith, all of the above are hereby incorporated by reference.

TECHNICAL FIELD

This invention relates to an integrated circuit, and more particularly, to Field Programmable Gate Array (FPGA) logic cells.

BACKGROUND OF THE INVENTION

FPGA is an integrated circuit whose functionalities are designated by users of the FPGA. A FPGA consists generally of a great number of logic cells.

A basic FPGA logic cell (referred below as LC) is shown as in FIG. 1, which comprises a look-up table (LUT) 102 and a D flip-flop (DFF) 108. The 4-input LUT 102 is shown to have a set of 16 configuration memory cells, which can be configured or programmed to compute any 4-input combinational logic function. Note that as the details of such programming circuitry is not relevant to this type of invention, it is not shown in FIG. 1. The output of the LUT 102 is not only directly connected to an output of the LC, but also fed into the D input terminal of DFF 108, the Q output of which is available as another LC output. Also not shown, the flip-flop 108 may also be provided with clock enable terminal, set terminal and/or reset terminal. Within the logic cell, multiplexers (MUX) and other logics may be provided to allow the Q output terminal of the flip-flop be connected to some input terminal of the LUT. In addition, output signals of logic cells may be routed to input terminals of logic cells via some general-purpose interconnection network, in order to build any given digital logic circuit.

The basic logic cell is logically complete. However, there exist demands for more area and timing efficient and/or placement-friendly logic cells and integrated circuits therefrom.

SUMMARY OF THE INVENTION

Therefore, it is an object of the present invention to provide a new LC, which may be interconnected and programmed to implement functions with more area and timing efficiency and/or placement-friendliness.

According to a first aspect, the present invention provides an integrated circuit having a plurality of logic cells, each of said plurality of the logic cells comprising:

a first input terminal, a second input terminal, a plurality of third input terminals, and a first output terminal;

a lookup table having a plurality of LUT input terminals, which are respectively connected to said plurality of third input terminals of the logic cell; and, a LUT output terminal;

a first multiplexer having a first multiplexer input terminal, a second multiplexer input terminal, a select terminal and an multiplexer output terminal; wherein, the first multiplexer input terminal of the first multiplexer is connected to the first input terminal, the second multiplexer input terminal of the first multiplexer is connected to the LUT output terminal, the multiplexer output terminal of the first multiplexer is connected to the first output terminal, and the select terminal is connected to the second input terminal and may be used to select which of the signals appearing at first multiplexer input terminal and the second multiplexer input terminal to pass through the first multiplexer;

wherein, by coupling in chain the first input terminal of one of the plurality of the logic cells to the first output terminal of another one of the plurality of logic cells, a WLUT chain is formed.

According to a second aspect, the present invention provides an integrated circuit having at least a first logic cell and a second logic cell, the first logic cell comprising: a LUT having a LUT output terminal, a circuit having a first circuit input terminal and a second circuit input terminal, and a first input terminal; wherein the LUT output terminal of the LUT is connected to the first circuit input terminal and the first input terminal is connected to the second circuit input terminal;

the second logic cell comprising: a LUT having a LUT output terminal, and a first output terminal, the first output terminal is connected to the LUT output terminal;

the first output terminal of the second logic cell is connected to the first input terminal of the first logic cell, thereby a buddy logic is formed.

According to a third aspect, an integrated circuit having a plurality of logic cells is provided. Each of said plurality of logic cells comprising:

a first input terminal, a second input terminal, a third input terminal, a plurality of fourth input terminals, a first output terminal and a second output terminal;

a LUT having a plurality of LUT input terminals, which are connected respectively to the plurality of fourth input terminals; and, a LUT output terminal;

a first multiplexer having a first multiplexer input terminal, a second multiplexer input terminal, a multiplexer select terminal and an multiplexer output terminal; wherein, the first multiplexer input terminal of the first multiplexer is connected to the first input terminal, the second multiplexer input terminal of the first multiplexer is connected to the third input terminal, and the multiplexer select terminal may be programmed to let the first multiplexer pass on either of two signals appearing at the first multiplexer input terminal and the second multiplexer input terminal of the first multiplexer;

a second multiplexer having a first multiplexer input terminal, a second multiplexer input terminal, a multiplexer select terminal and an multiplexer output terminal; wherein, the first multiplexer input terminal of the second multiplexer is connected to the multiplexer output terminal of the first multiplexer, the second multiplexer input terminal of the second multiplexer is connected to the LUT output terminal, the multiplexer select terminal of the second multiplexer is connected to the second input terminal and the multiplexer output terminal of the second multiplexer is connected to the first output terminal;

a circuit having a first circuit input terminal, a second circuit input terminal, and a circuit output terminal; wherein, the first circuit input terminal is connected to the LUT output terminal, the second circuit input terminal is connected to the third input terminal;

a third multiplexer having a first multiplexer input terminal, a second multiplexer input terminal, a third multiplexer input terminal, a multiplexer select terminal, and a multiplexer output terminal; wherein, the first multiplexer input terminal of the third multiplexer is connected to the LUT output terminal, the second multiplexer input terminal of the third multiplexer is connected to the multiplexer output terminal of the second multiplexer, the third multiplexer input terminal of the third multiplexer is connected to the circuit output terminal of the circuit, and the multiplexer select terminal may be programmed to pass on any one of the signals appearing at the first, second and third multiplexer input terminals of the third multiplexer.

The above and other objects, features, and advantages of the present invention will become apparent from the following detailed description thereof, which is described with reference to the accompanying drawings in which the like reference numerals represent the same or similar elements.

BRIEF DESCRIPTION OF THE DRAWING

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PREFERRED EMBODIMENT

Please note that in the figures to be discussed below, each LC will have more or less similar components, and throughout these figures, those components having basically the same function will be labeled with similar numbers, with the last digit in each of the labels being the same.

Figure 1:
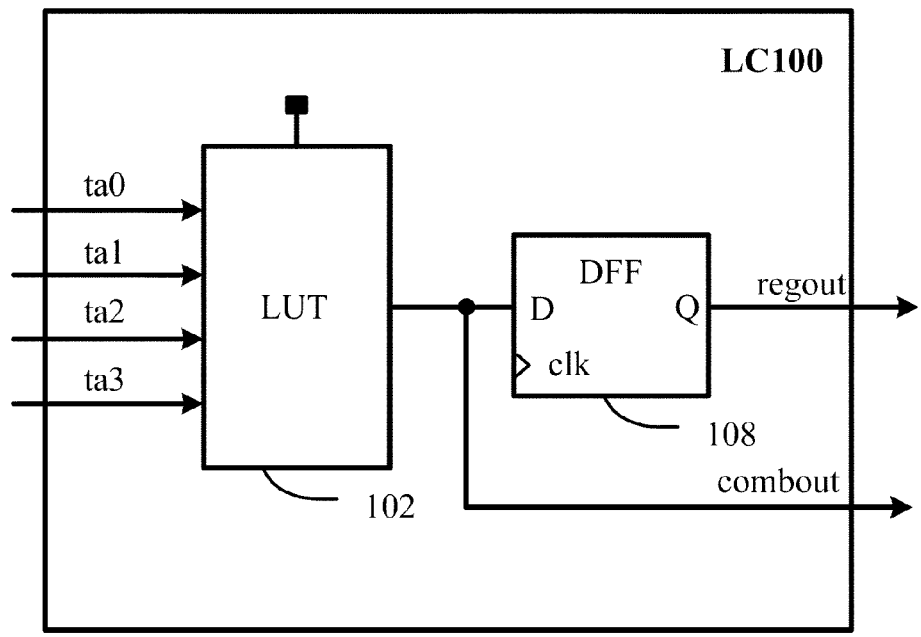
FIG. 1 illustrates a basic logic cell including a LUT and a D flip-flop.
Figure 2:
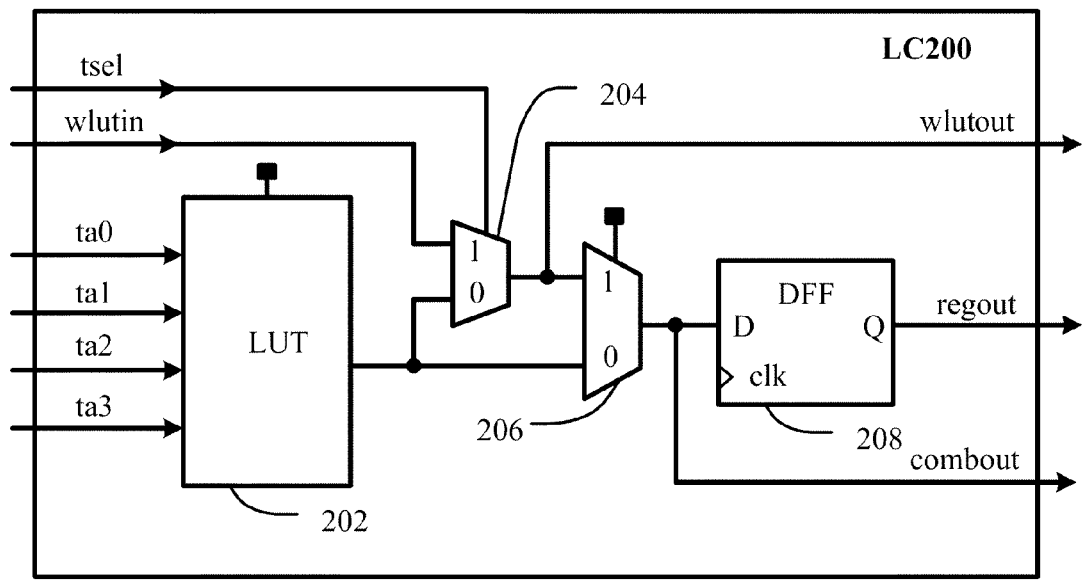
FIG. 2 illustrates a logic cell according to a first embodiment of the present invention.

FIG. 2 illustrates a logic cell according to a first embodiment of the present invention. As shown in FIG. 2, the logic cell 200 includes a 4-input terminal LUT 202, a first multiplexer 204, a second multiplexer 206, and a D flip-flop 208. The logic cell includes four input terminals, ta0, ta1, ta2 and ta3, which are also input terminals of LUT 210. The Logic cell includes two additional input terminals, i.e., tsel and wlutin, and three output terminals, i.e., wlutout, regout and combout.

LUT 202 has an output terminal. LUT 202 may implement any function of four variables.

The first multiplexer 204 has two data input terminals, input terminal 0 and input terminal 1; an output terminal; and, a select terminal. Input terminal 0 of the multiplexer 204 is connected to the output terminal of LUT 202; Input terminal 1 is connected to the input terminal wlutin; the select terminal is connected to the input terminal tsel, and may be used to select which of the two inputs of multiplexer 204 will be output. The output terminal of multiplexer 204 is connected to the output terminal wlutout.

The second multiplexer 206 has two data input terminals, input terminal 0 and input terminal 1; an output terminal; and, a select terminal. Input terminal 1 of the second multiplexer 206 is connected to the output terminal of the first multiplexer 204 and input terminal 0 is connected to output terminal of LUT 202. The select terminal is driven by a static configuration bit. The output terminal of the second multiplexer 206 is connected to D input terminal of flip-flop 208 and to the output terminal combout.

In operation, the select terminal of multiplexer 206 may be configured appropriately to pass the output signal of LUT 202 through the second multiplexer 206 and then output both at output terminal regout via the flip-flop 208 and directly at the output terminal combout.

According to the present invention, the first multiplexer 204 is used to multiplex signal from the input terminal wlutin and signal from the output terminal of LUT 202 and the multiplexed signal will be output at the output terminal wlutout. The signal tsel may be used to select which of the two will be output by the first multiplexer 204. If configuring the select terminal of multiplexer 206 appropriately, the multiplexed signal may also be output either at the terminal combout or at the terminal regout via D flip-flop 208.

In conclusion, a signal output by LUT 202 may be output at output terminal wlutout via first multiplexer 204, at output terminal regout via multiplexer 206 and flip-flop 208, or at output terminal combout via multiplexer 206.

Similarly, the LC 200 may receive a signal from the LUT of a neighboring LC at the input terminal wlutin, multiplex the signal at the first multiplexer 204, and then output at the output terminals wlutout, regout, or combout.

Therefore, a WLUT chain may be formed by a plurality of such LCs, by connecting in chain the input terminal wlutin of one LC to the output terminal wlutout of another LC. The term 'WLUT' means a wide LUT that has more inputs than a standalone LUT has.

Figure 3:
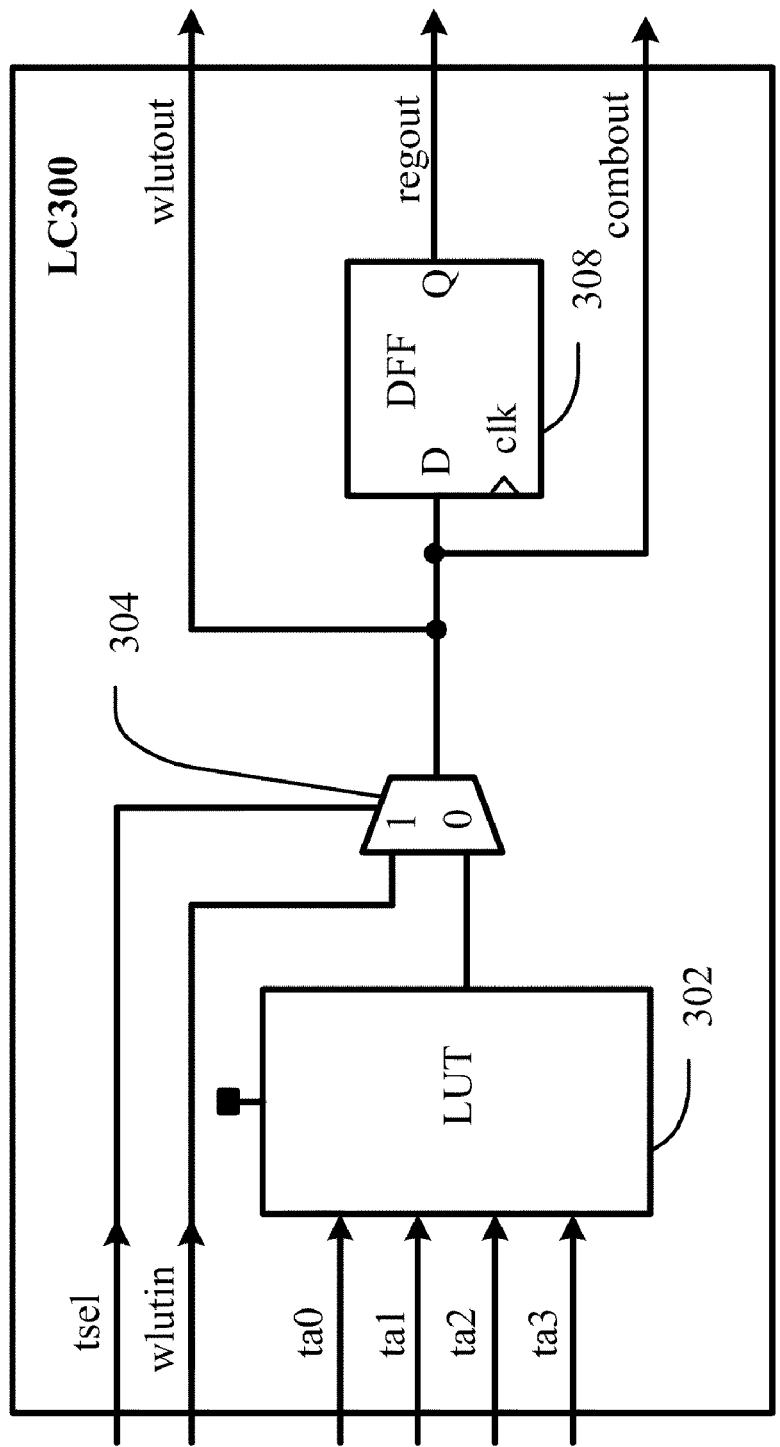
FIG. 3 illustrates a logic cell according to a second embodiment of the present invention.

FIG. 3 illustrates a logic cell according to a second embodiment of the present invention. FIG. 3 differs from FIG. 2 in that it has only one multiplexer 304, which corresponds to multiplexer 204 in FIG. 2, with a multiplexer 206 omitted. Multiplexer 304 functions to multiplex signals from both input terminal tsel and output terminal of LUT 304. Therefore, a WLUT chain may be formed by connecting in chain input terminal wlutin and output terminals wlutout of such LCs 300.

In addition, LC 300 may function as a normal LC. By choosing signal at input terminal tsel, the output of LUT 302 may be fed directly to D-input of D flip-flop 308 and output terminal combout.

Figure 4:
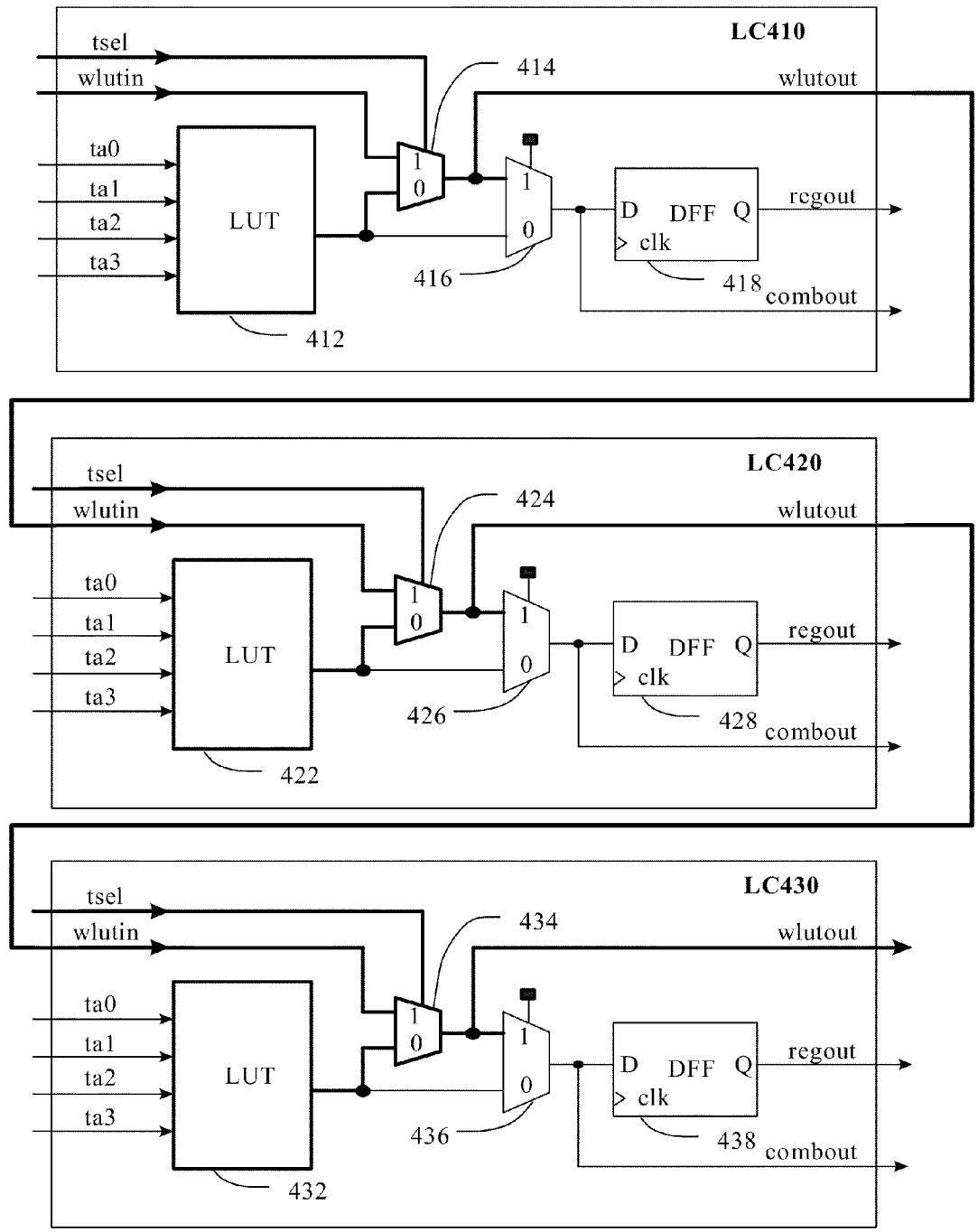
FIG. 4 illustrates a WLUT chain formed by logic cells as shown in FIG. 2.

FIG. 4 illustrates a WLUT chain formed by logic cells as shown in FIG. 2. As shown in FIG. 4, there are 3 LCs, i.e., LC 410, LC 420 and LC 430. Each of the LC 410, LC 420, and LC 430 has the same structure as LC 200 in FIG. 2. Therefore, the description of the detailed structure thereof will be omitted for the sake of simplicity. Note that configuration memory cells of the LUTs are not shown, just for the sake of simplicity, in this figure and some of the figures to be discussed below.

The output terminal wlutout of LC 410 is connected to the input terminal wlutin of LC 420 and the output terminal wlutout of LC 420 is connected to the input terminal wlutin of LC 430.

A signal, which may be an output of the LUT of a neighboring LC, is input at the input terminal wlutin into LC 410. In LC 410, it is multiplexed with the output of LUT 412 at multiplexer 414, and the multiplexed signal is output via its output terminal wlutout; then, in LC 420, the signal from the output terminal wlutout of LC 410 is multiplexed with the output signal of LUT 422 at multiplexer 424 and multiplexed signal is output at its output terminal wlutout; and then, in LC 430, the signal from the output terminal wlutout of LC 420 is multiplexed with the output signal of LUT 432 at multiplexer 434 and the multiplexed signal is output at its output terminal wlutout.

Thereby, a WLUT chain is formed, which is indicated by the thick black lines from wlutin of LC 410 to wlutout of LC 430.

Please note that each LC in the LUT chain may select to pass on either its own LUT output or LUT outputs of upstream LCs in the chain. For example, by appropriately choosing signals at respective select terminals tsel of the three LCs, the output signal of the LUT 412 of LC 410 may be passed on along the chain to terminals wlutout of LC 410, LC 420, and LC 430. Further, by appropriately programming the respective select terminals of the multiplexers 416, 426, and 436, the output signal of LUT 412 of LC 410 may be output by any of the three LCs at their respective output terminals, either combout or regout.

The WLUT chain as shown in FIG. 4 may be used to implement complex logic functions, such as LUT5 and bus multiplexer. Compared with similar traditional logic circuits, the WLUT chain approach uses fewer logic cells to implement some common logic functions. Also, performance will be enhanced due to the fact that LUTs coupled with general purpose interconnect have been replaced with multiplexers coupled with faster dedicated WLUT chains.

Figure 5:
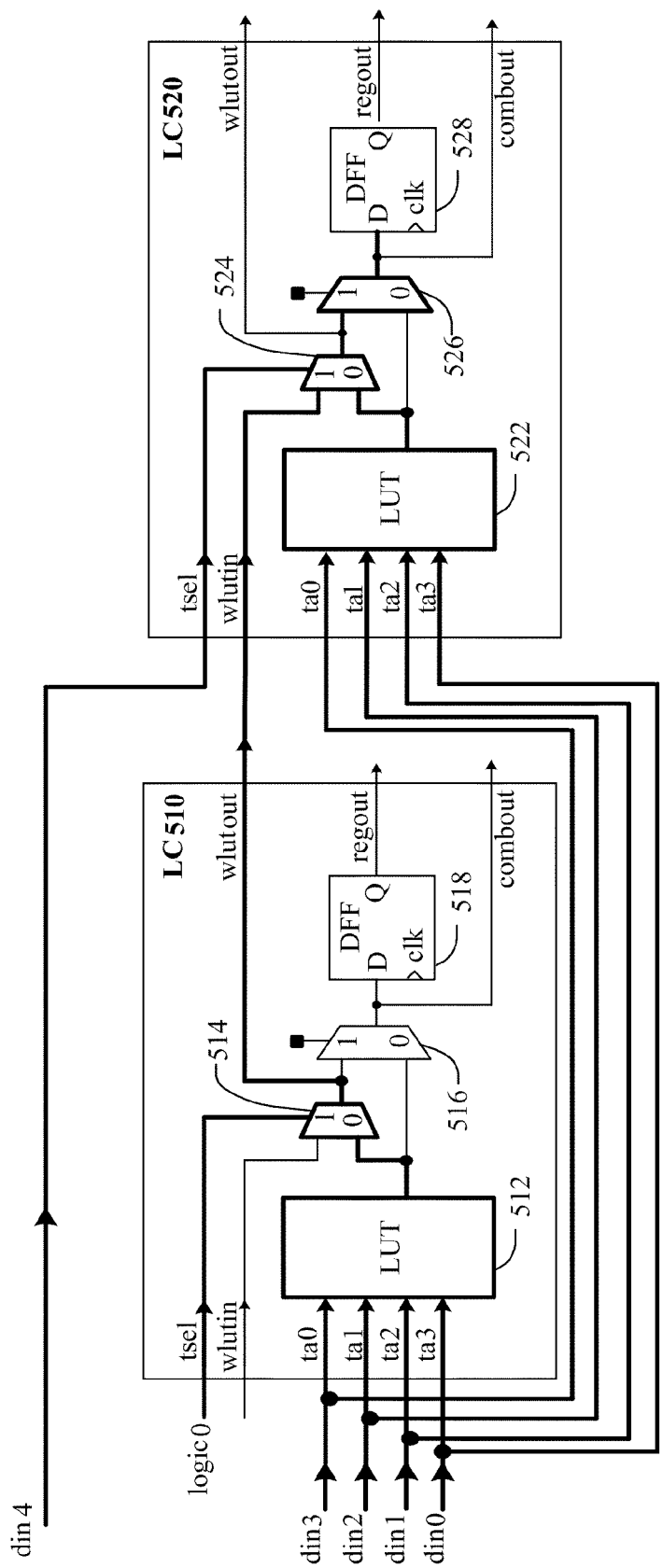
FIG. 5 illustrates a 5-input LUT (LUT5) formed by the WLUT chain of FIG. 4.

FIG. 5 illustrates a 5-input LUT formed by the WLUT chain of FIG. 4. As shown in FIG. 5, this LUT5 is formed by two LCs, LC 510 and LC 520. The LC 510 and LC 520 have the same structure as LC 200 in FIG. 2.

The LUT5 has five input terminals, din 0, din 1, din 2, din 3 and din 4. signals from dins 0-3 are fed to both LUTs 512 of LC 510 and LUT 522 of LC 520 at their respective input terminals ta0, ta1, ta2 and ta3. By choosing the terminal tsel of LC 510 to be a logic 0, the output signal of LUT 512 is selected to be output at terminal wlutout of LC 510 and multiplexed with that of LUT 522 by multiplexer 524 of LC 520. A signal from din 4 is fed via input terminal tsel of LC 520 to select terminal of multiplexer 524 of LC520, and then, decide which is to be selected, output of LUT 512 or output of LUT 522. By appropriately programming LUT 512, LUT 522 and select terminal of multiplexer 526, the logic circuit of FIG. 5 can implement a LUT5 using only two logic cells with a delay that is slightly larger than that of a LUT4. This compares favorably with the traditional approach of building a LUT5 out of 3 LUT4 with two levels of LUT delay plus a slower general interconnect delay.

Figure 6:
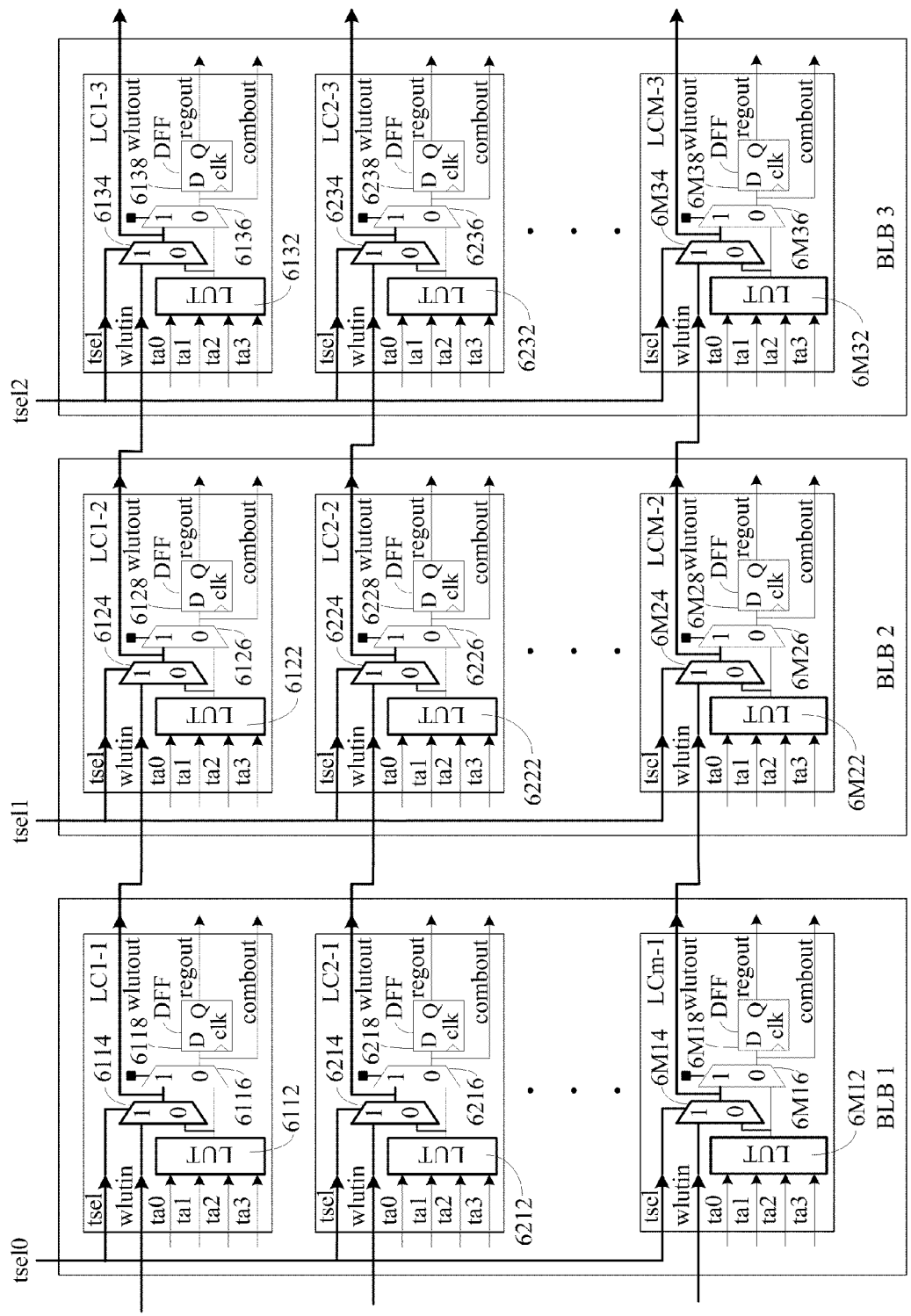
FIG. 6 illustrates a bus multiplexer formed by the WLUT chain of FIG. 4.

FIG. 6 illustrates a bus multiplexer formed by the WLUT chain of FIG. 4. As shown in FIG. 6, there are three basic logic blocks (referred below as BLB), BLB 1, BLB 2, and BLB 3. BLB 1 includes LCs 1-1, 2-1, ..., and M-1; BLB 2 includes LCs 1-2, 2-2, ..., and M-2; and, BLB 3 includes LCs 1-3, 2-3, ..., and M-3. Each of the LCs has the same structure as LC200 in FIG. 2.

The three LCs, LC 1-1, LC 1-2 and LC 1-3, in the first row constitute a WLUT chain, in which the output of LUT 6112 of LC 1-1 and that of LUT 6122 of LC 1-2 are multiplexed by multiplexer 6124 in LC 1-2, and then multiplexed with the output of LUT 6132 by multiplexer 6134.

Correspondingly, LC i-1, LC i-2 and LC i-3 in row i constitute a WLUT chain, wherein, i=2, ..., M, respectively.

Please note that LCs 1-1, 2-1, ..., and M-1 in BLB 1 share the same select signal tsel0 for their respective multiplexer 6j14; LCs 1-2, 2-2, ..., M-2 in BLB 2 share the same select signal tsel1 for their respective multiplexer 6j24; and, LCs 1-3, 2-3, ..., M-3 in BLB 3 share the same select signal tsel2 for their respective multiplexer 6j34; wherein j=1, ..., M. By choosing the signals tsel0 and tsel1, the LCs (thus, LUTs) in BLB 1 may inject their outputs to output terminals of the corresponding LCs in BLB 2 or BLB 3. Therefore, the LCs in BLB 1 embed an M-bit wide 2-to-1 multiplexer.

Similarly, the LCs (LUTs) in BLB 2 may inject their outputs to output terminals of the corresponding LCs in BLB 2 or BLB 3, embedding an M-bit wide 2-to-1 multiplexer. The LCs (LUTs) in BLB 3 may inject their outputs to their own output terminals, embedding an M-bit wide 2-to-1 multiplexer. These LCs in BLBs 1, 2 and 3 constitute in combination an M-bit wide 3-to-1 bus multiplexer.

Please note that a different combination of select signals tsel0, tsel1 and tsel2 may lead to a different chain output at the rightmost terminal wlutout of the chain. Let us define that signals tsel0, tsel 1, and tsel2 equal to '0' represent that they inject LUT outputs of the LCs which they are driving onto the chain, and signals equal to '1' represent that they inject LUT output from adjacent upstream LC onto the chain.

In case that there is only one signal among the three signals equal to '0', i.e., {0, 1, 1}, {1, 0, 1}, {1, 1, 0}, the LUT output of the LC being driven by signal '0' will be passed on to the chain output.

In case that there is at least two signal among the three signals equal to '0', i.e., {0, 0, 0}, {0, 0, 1}, {0, 1, 0}, {1, 0, 0}, the LUT output that belong to the LC rightmost being driven by signal '0' will be passed on to the chain output. Therefore, a priority may arise from such a big bus multiplexer. In an example, the logic function with highest priority is preferred to be placed at the rightmost side of the bus multiplexer and the logic function with lowest priority may be arranged at the left side.

Although an M-bit wide 3-to-1 bus multiplexer has been shown in the figure, it may be extended to be an M-bit wide N-to-1 bus multiplexer, which will be formed by M×N LUTs and M×N multiplexers. Of course, the number of tsel signals shall be increased to N.

In the M-bit wide N-to-1 bus multiplexer, each LC may have different input signals for their respective LUT, or share the same set of input signals with some or all of the other LCs.

In one scenario, LUTs in each BLB share one and the same set of wide input signals but performs different algorithm operations, such as ADD and SUB. By choosing the bus selection signals, different algorithm operation result may be selected to output.

In another scenario, LUTs in each BLB may have different input signals and output different address signals. By choosing the bus selection signals, different addresses may appear at corresponding output terminals.

In an embodiment, carry chains may be added to LUTs of at least a part of the LCs so as to carry out particular algorithms in the bus multiplexer.

Integrated circuit having the bus multiplexer as set forth above occupies less area because groups of LUTs have been omitted. Also, the bus multiplexer leads to a shorter delay since fixed connections are adopted. Taking the leftmost LUT for example, it goes through 3 multiplexers to reach the rightmost output terminal of the bus multiplexer.

Figure 7:
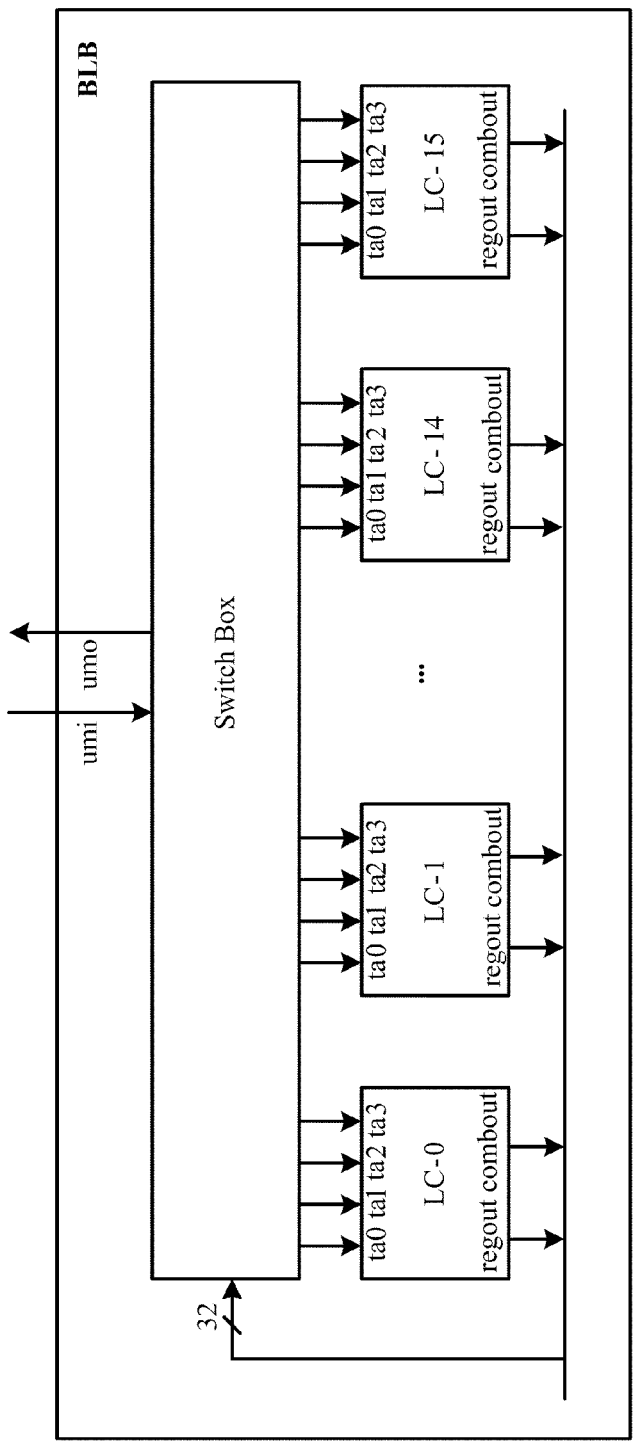
FIG. 7 illustrates an example of interconnection between logic cells in a basic logic block.

Please note that, in FIG. 6, terminals wlutin of LCs are connected to terminals wlutout of respective adjacent LCs. The other input and output terminals of the LCs will be connected via switch boxes within the same BLB or between BLBs. FIG. 7 illustrates an example of interconnection between logic cells in a basic logic block. Within the BLB, LC-0, LC-1, . . . , LC-14 and LC-15 have their respective inputs ta0, ta1, ta2, ta3; and outputs regout and combout. The inputs ta0-ta3 and outputs regout and combout of LC-0 are connected to a switch box of the BLB, from which LC-0 may be routed to other LCs within the same BLB or to outside LCs via input terminal umi and output terminal umo of the BLB. Similarly, each of LC-1, . . . , LC-14 and LC-15 may be routed to other LCs within the same BLB or to LCs outside through the switch box. Although not shown in FIG. 7, input terminals tsel will also be connected to the switch box so as to be routed to other LCs within the same BLB or outside.

Please note that although the integrated circuits in FIG. 4-6 are shown to consist of logic cells as shown in FIG. 2, they may also be formed by logic cells as shown in FIG. 3.

Figure 8:
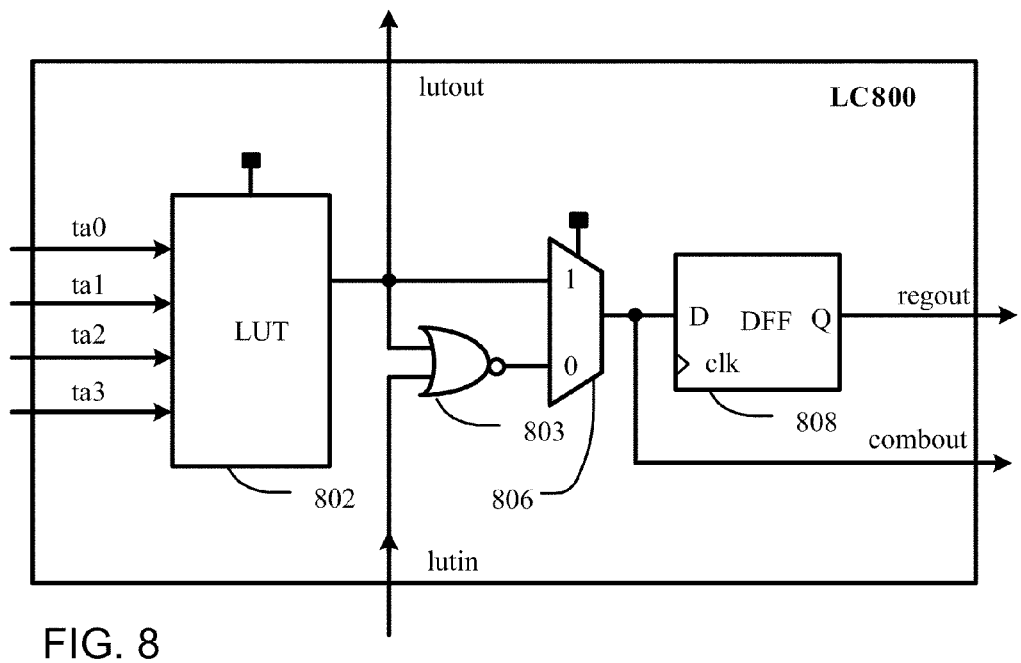
FIG. 8 illustrates a logic cell according to a third embodiment of the present invention.

FIG. 8 illustrates a logic cell according to a third embodiment of the present invention. As shown, LC 800 has a 4-input LUT 802, a NOR gate 803, a multiplexer 806, and a D flip-flop 808. The LC 800 includes four input terminals, ta0, ta1, ta2 and ta3, which are also input terminals of LUT 802. The LC includes two output terminals, i.e., regout and combout. Besides, the LC includes another input terminal lutin and another output terminal lutout.

In addition to the 4 input terminals, ta0, ta1, ta2 and ta3, LUT 802 has an output terminal, which is connected to the output terminal lutout. The NOR gate 803 has two data input terminals, and an output terminal. One of the Input terminals of the multiplexer 803 is connected to output terminal of the LUT 802 and the other input terminal is connected to the input terminal lutin.

The multiplexer 806 has two data input terminals, input terminal 0 and input terminal 1; an output terminal; and, a select terminal. Input terminal 0 of the multiplexer 806 is connected to the output terminal of NOR gate 803, and input terminal 1 is connected directly to the output terminal of the LUT 802. The select terminal is driven by a static configuration bit. The output terminal of the multiplexer 806 is connected to D input terminal of flip-flop 808 and to the output terminal combout.

In operation, the select terminal of multiplexer 806 may be programmed to select the signal at input terminal 1 of multiplexer 806, which is the output of LUT802, as the output of the multiplexer 806. Then, the signal will be passed on to output terminal combout or at output terminal regout via flip-flop 808.

In another approach, a signal, which may be an output from the LUT of a neighboring LC, is input into LC 600 at the input terminal lutin. The signal is then NORed with the output signal of LUT 802 and the resulting signal is input into the multiplexer 806 at input terminal 0. By configuring the select terminal, the NORed signal may be output directly at the output terminal combout, or output via flip-flop 808 to output terminal regout.

Thereby, a buddy logic may be formed, in which a NOR gate carries out a NOR operation with respect to an output of LUT 802 and an output from LUT(s) in another LC.

Figure 9:
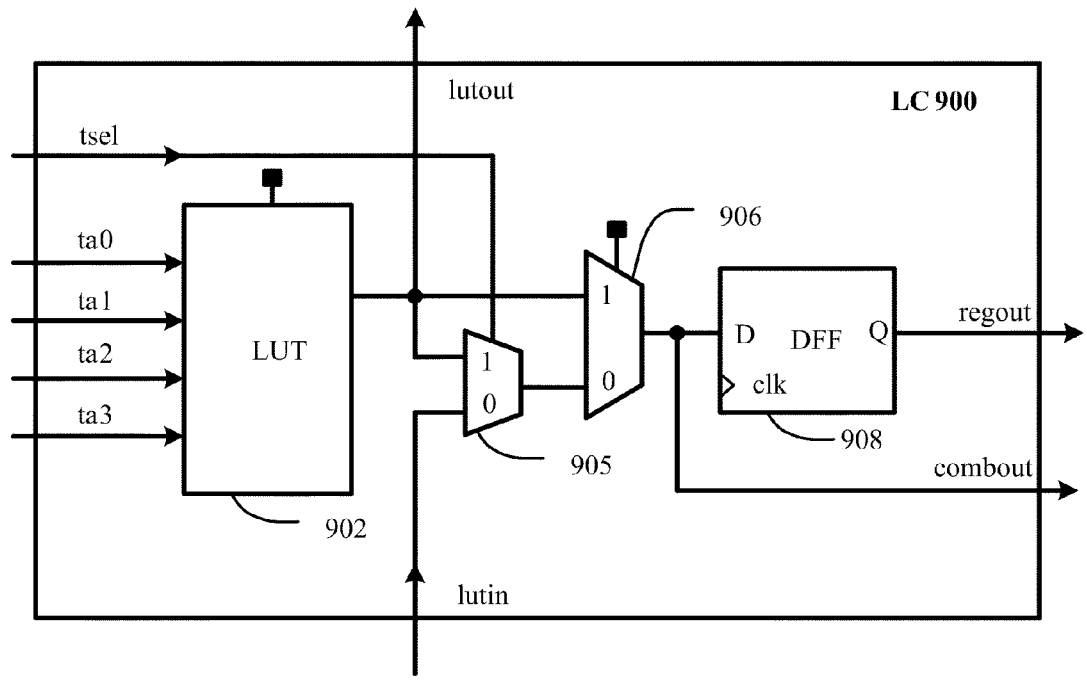
FIG. 9 illustrates a logic cell according to a fourth embodiment of the present invention.

FIG. 9 illustrates a logic cell according to a fourth embodiment of the present invention. This embodiment differs from FIG. 8 in that the NOR gate 803 is replaced with a multiplexer 905, which has a select terminal connected to input terminal tsel of the LC.

In operation, output signal of LUT 902 appearing at input terminal 1 of multiplexer 906 may be selected by multiplexer 906 and output at output terminal combout or at output terminal regout via flip-flop 908.

In another approach, a signal, which may be an output from the LUT of a neighboring LC, is input into LC 900 at the input terminal lutin. The signal is then multiplexed in multiplexer 905 with the output of LUT 902. By choosing the signal tsel, either the output of LUT 902 or that from the neighboring LC is selected by multiplexer 905 to output to the multiplexer 906 at its input terminal 0. In multiplexer 906, if programming its select terminal appropriately, the multiplexed signal from multiplexer 905 may be output directly at the output terminal combout, or at output terminal regout via flip-flop 908. Thereby, a buddy logic may be formed, in which a multiplexer carries out a multiplex operation with respect to an output of LUT 902 and an output from another LUT in physically neighboring LC.

It would be appreciated that, instead of NOR and multiplexer as mentioned above, other circuit such as AND, NAND, OR and XOR gate may also be adopted to form a buddy logic.

Further, the buddy logic may be formed by more than 2 LUTs, instead of paired LUTs. For example, outputs of a first LUT, a second LUT, and a third LUT may be connected respectively to input terminals of a circuit such as multiplexer, AND, NAND, OR, NOR and XOR to form a buddy logic.

The buddy logic can be adopted to implement certain logic operations. The resulting integrated circuit will occupy less area because less number of cells is needed. In addition, the performance will be enhanced due to the fact that LUTs having slower speed have been replaced with much faster logics. Further, compared with a long chain, the buddy logic uses only a dedicated LC-to-LC link, coupling either the nearest LC either above or below, and thus placement of the two buddy LCs are very flexible.

Figure 10:
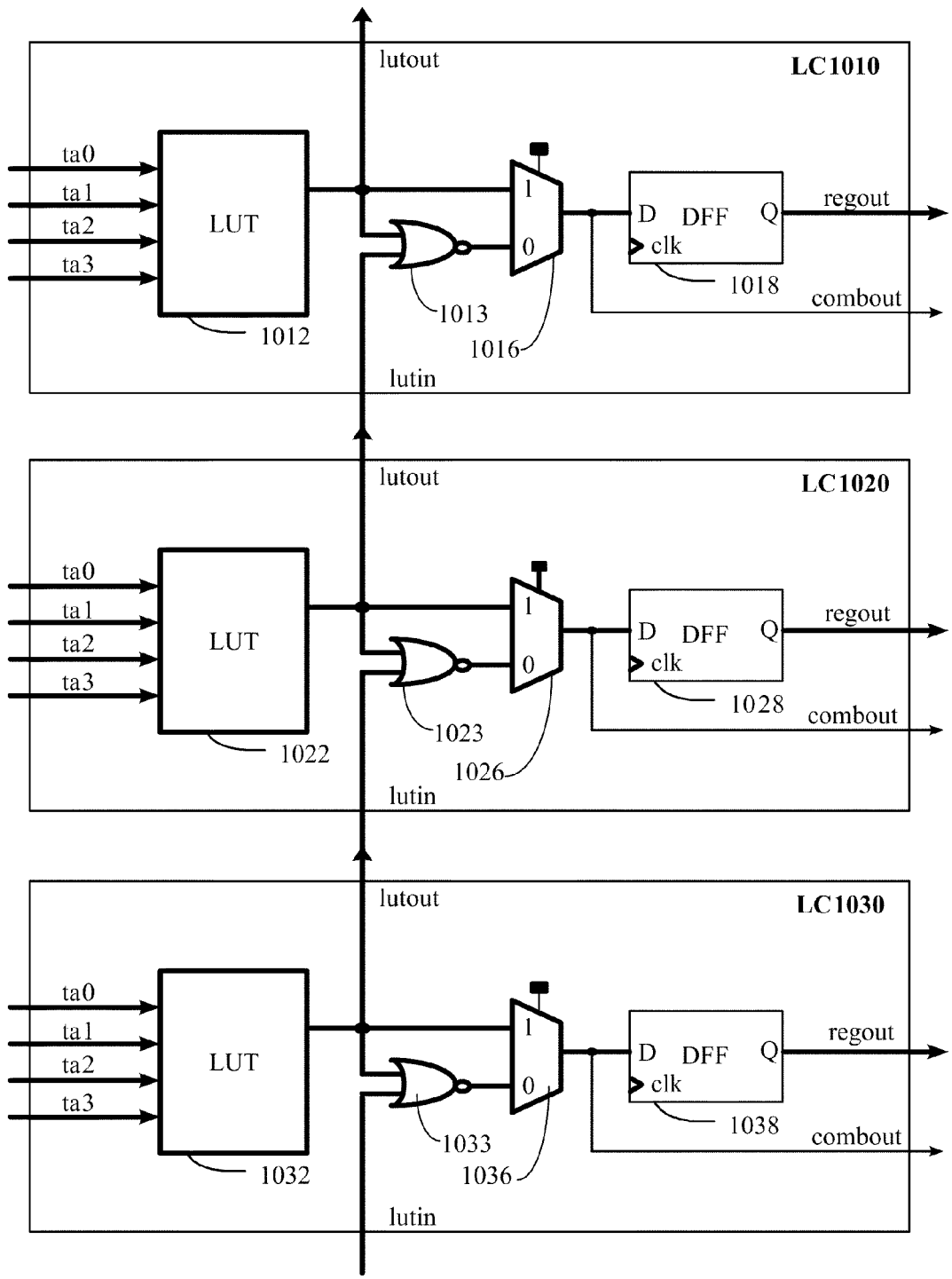
FIG. 10 illustrates a buddy logic formed by logic cells as shown in FIG. 8.

FIG. 10 illustrates a buddy logic formed by logic cells as shown in FIG. 8. As shown, there are three LCs, LC 1010, LC 1020 and LC 1030. Each LC has the same structure as the LC in FIG. 8. The output terminal lutout of LC 1030 is connected to input terminal lutin of LC 1020 and the output terminal lutout of LC 1020 is connected to input terminal lutin of LC 1010.

In operation, output signal of LUT 1032 is fed at the output terminal lutout of LC 1030 to LC 1020. In LC 1020, NOR gate 1023 carries out a NOR operation with respect to the output of LUT 1032 and the output from LUT 1022. By configuring select signal of multiplexer 1026, the NORed signal may be selected to output, either at output terminal combout or at output terminal regout via D flipflop 1028.

Similarly, output of LUT 1022 and the output from LUT 1012 are NORed by NOR gate 1013 and may be selected to output, either at output terminal combout of LC 1010 or at output terminal regout via D flipflop 1018.

The buddy logic may thus be used to implement efficiently many common logic functions, such as decoders and encoders.

Figure 11:
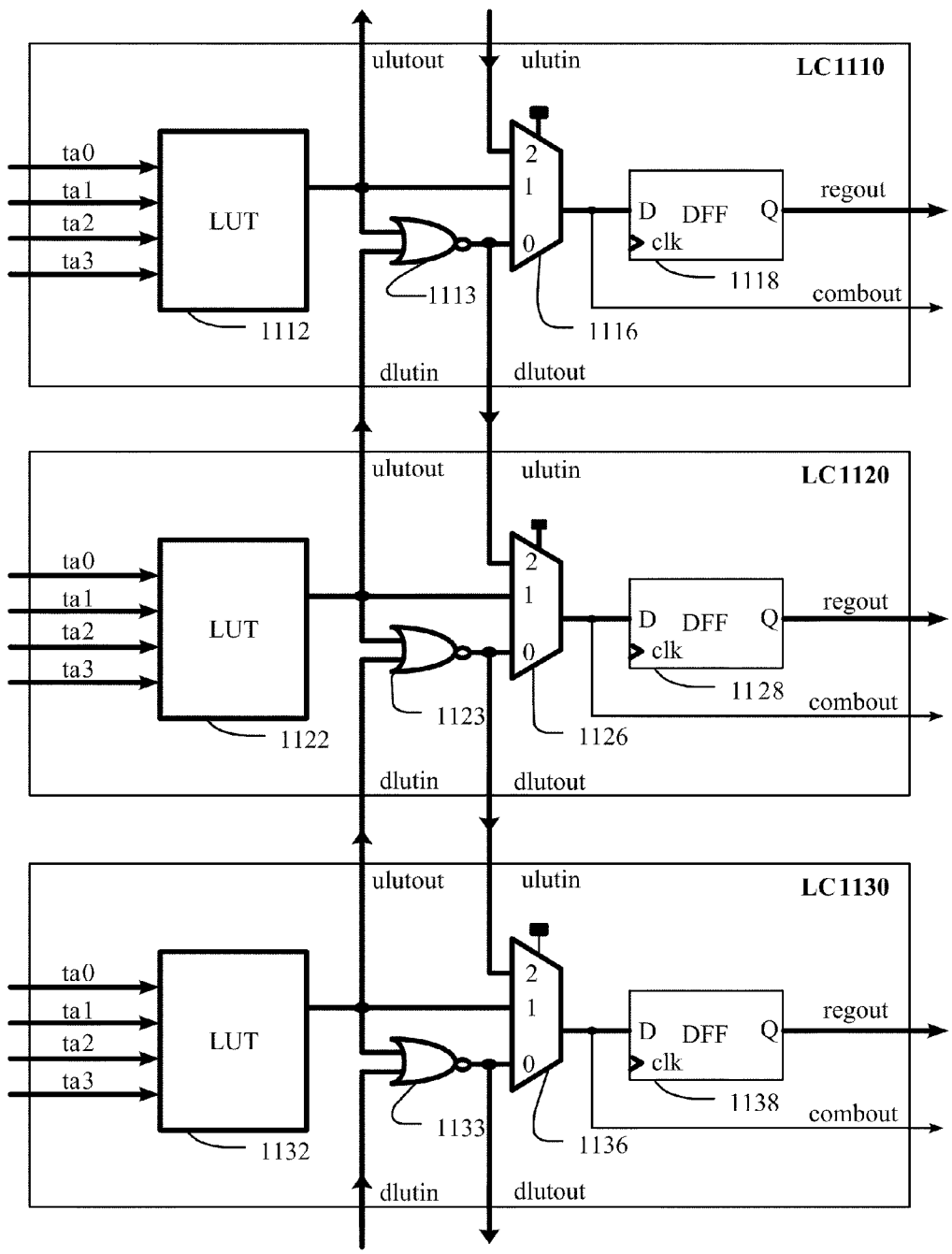
FIG. 11 illustrates another kind of buddy logic formed by logic cells as shown in FIG. 8.
Figure 12:
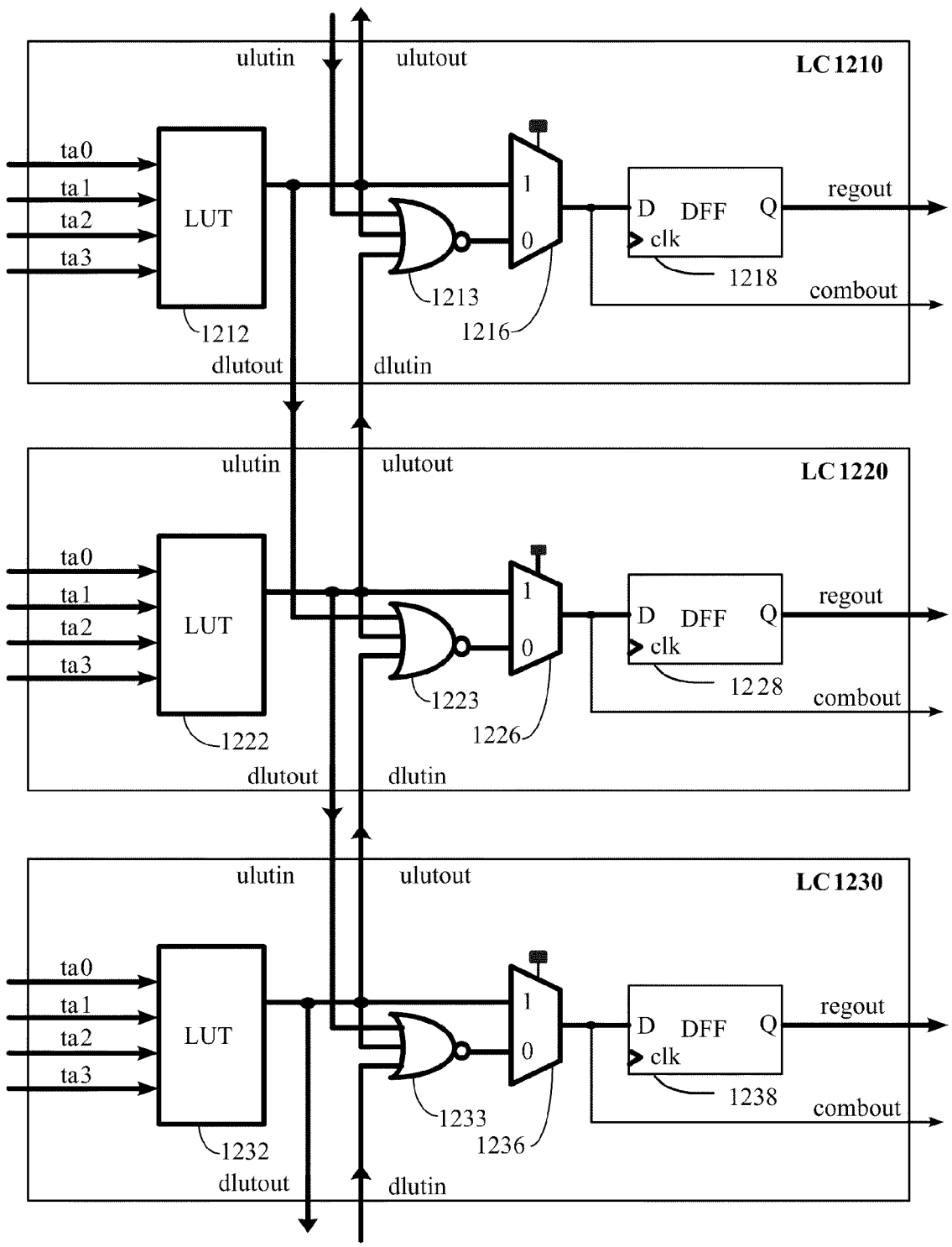
FIG. 12 illustrates a further buddy logic formed by logic cells as shown in FIG. 8.

Please note that in FIG. 10, the NORed signal by multiplexer 1016 could only be output in LC 1010. That is, the output of LUT 1012 and LUT 1022 could only be NORed and output in LC 1010. FIG. 11 and FIG. 12 illustrate different buddy logics.

As shown in FIG. 11, there are three LCs, LC 1110, LC 1120, and LC 1130, which differ from LC 810 of FIG. 8 in that they have two pairs of lutout and lutin terminals and a three-input multiplexer instead of a two-input multiplexer. The two pair of lutout and lutin terminals are re-marked as ulutout and ulutin, dlutout and dlutin since the upper terminals ulutout and ulutin are to be connected to a upper adjacent LC and the lower terminals dlutout and dlutin are to be connected to a downwards adjacent LC.

In LC 1110, terminal ulutout is connected to the output terminal of LUT 1112, and terminal dlutin is connected to one of the two inputs of NOR gate 1113. Terminals ulutin and dlutout are respectively connected to input 2 of multiplexer 1116 and output terminal of NOR gate 1113.

LC 1120 and LC 1130 have the same structure as LC 1110.

Terminals dlutin and dlutout of LC 1110 are connected respectively to terminals ulutout and ulutin of LC 1120; Terminals dlutin and dlutout of LC 1120 are connected respectively to terminals ulutout and ulutin of LC 1130.

Therefore, NOR gate 1113 of LC 1110 conducts a NOR operation with respect to output of LUT 1112 and output of LUT 1122, and passes the NORed signal on to both input 0 of multiplexer 1116 and input 2 of multiplexer 1126, and thus the NORed signal may be output via both LC 1110 and LC 1120. Similarly, NORed signal formed by output of LUT 1122 and output of LUT 1132 may be output via both LC 1120 and LC 1130.

FIG. 12 illustrates a different approach. In this case, LC 1210, LC 1220, and LC 1230 are similar to those of LCs 1110, 1120, and 1130. The difference is that each of LC 1210, LC 1220, and LC 1230 has a three-input NOR gate and two-input multiplexer instead of a three-input multiplexer and a two-input NOR gate.

In LC 1210, input terminal ulutin is connected to one of the three inputs of NOR gate 1213 and output terminal of LUT 1212 is connected to terminal dlutout. LC 1220 and LC 1230 have the same structure as LC 1210.

Terminals dlutin and dlutout of LC 1210 are connected respectively to terminals ulutout and ulutin of LC 1220; Terminals dlutin and dlutout of LC 1220 are connected respectively to terminals ulutout and ulutin of LC 1230.

In operation, NOR gate 1223 of LC 1220 receives output of LUT 1212, output of LUT 1222, and output of LUT 1232 and conducts a NOR operation with respect to them. The NORed signal may be selected by multiplexer 1226 to pass on and output via output terminal combout or regout of LC 1220. Please note that this buddy logic has a three input instead of the two input as shown in both FIG. 10 and FIG. 11.

Figure 13:
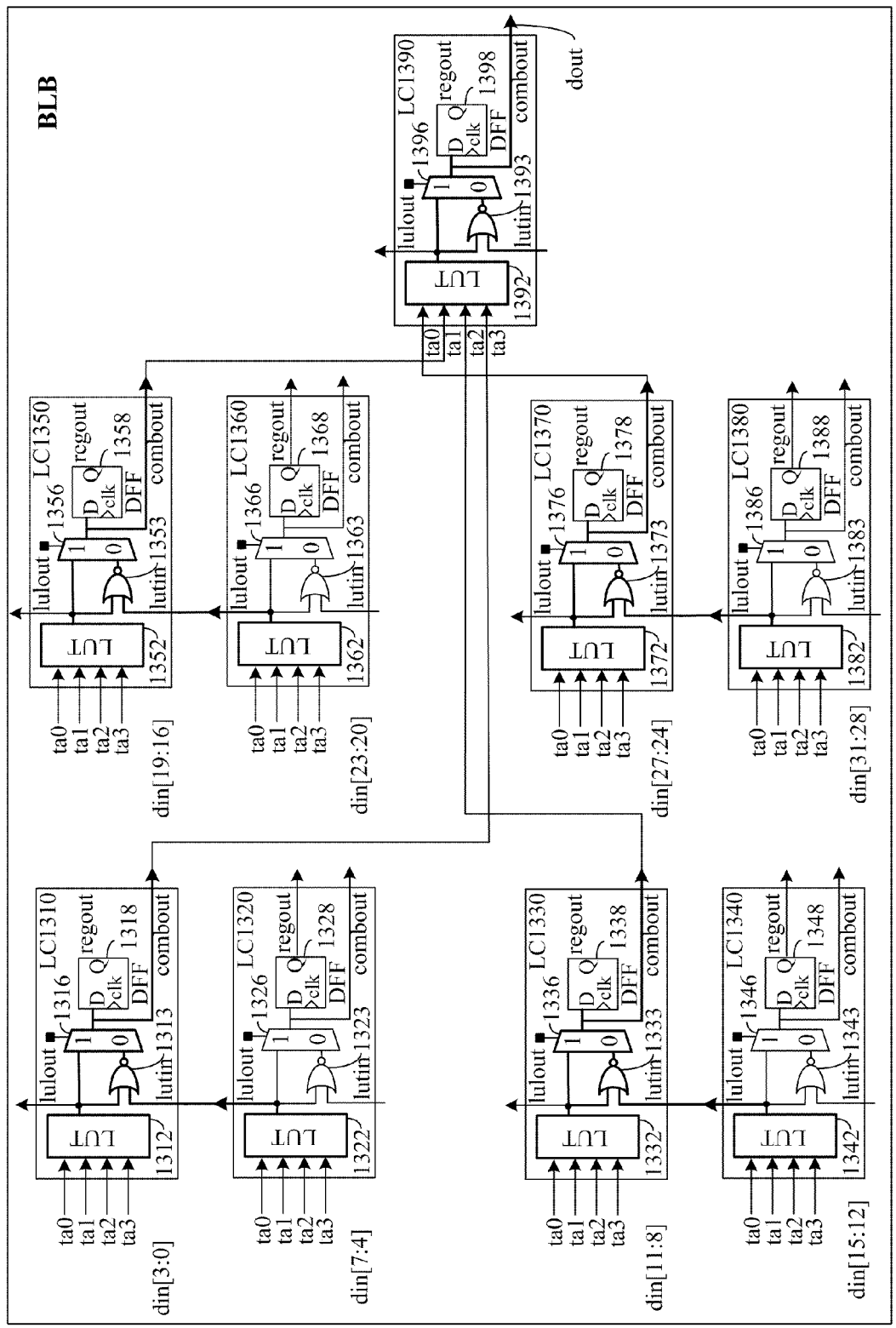
FIG. 13 illustrates a 32-bit decoder formed by using the buddy logic as shown in FIG. 10.

FIG. 13 illustrates a 32-bit decoder formed by buddy logics. As shown in FIG. 13, there are 9 LCs, LC 1310, 1320, . . . and 1390 in a BLB. Each of LC 1310-1380 is the same as the LC in FIG. 8 and is connected in chain with each other to form a buddy logic. For example, in LC 1310, output of LUT 1312 in LC 1310 and output of LUT 1322 in LC 1320 are NORed by NOR gate 1313 and the NORed signal is input at input terminal 0 of multiplexer 1316.

Similarly, in LC 1330, output of LUT 1332 in LC 1330 and output of LUT 1342 in LC 1340 are NORed by NOR gate 1333 and the NORed signal is input at input terminal 0 of multiplexer 1336; In LC 1350, output of LUT 1352 in LC 1350 and output of LUT 1362 in LC 1360 are NORed by NOR gate 1353 and the NORed signal is input at input terminal 0 of multiplexer 1356; In LC 1370, output of LUT 1372 in LC 1370 and output of LUT 1382 in LC 1380 are NORed by NOR gate 1373 and the NORed signal is input into input terminal 0 of multiplexer 1376. The output terminals of multiplexers 1316, 1336, 1356, and 1376 are respectively connected, via terminals combout of respective LCs, to input terminals ta3, ta2, ta1, ta0 of LUT 1392 of LC 1390, which may have the same structure as LCs 1310-1380. In LC 1390, the output of LUT 1392 may be selected to output by multiplexer 1396. By appropriately configuring select terminal of multiplexer 1316, 1336, 1356, 1376 and 1396, a 32-bit decoder may thus be achieved.

In operation, a 32-bit input signal is input into the decoder. This signal is split into groups of sub-signals, din[3:0], din[7:4], din[11:8], din[15:12], din[19:16], din[23:20], din[27:24], din[31:28], which are respectively input via input terminals ta0, ta1, ta2, ta3, into LCs 1310-1380. When the 32-bit input signal is equal to a particular number, the 32:1 decoder will output '1' at terminal dout or terminal combout; otherwise, output thereof is 0.

The decoder above runs faster and occupies less area because some LUTs are omitted. In fact, it achieves the theoretical minimal depth of two LCs, as it is impossible to implement using only one level of LC with LUT4. Further, although the buddy logics have been shown connected to each other, each pair of buddy LC can be placed anywhere within the BLB. Therefore, the decoder thus formed may have a flexible placement due to interchangeability between the LCs.

Figure 14:
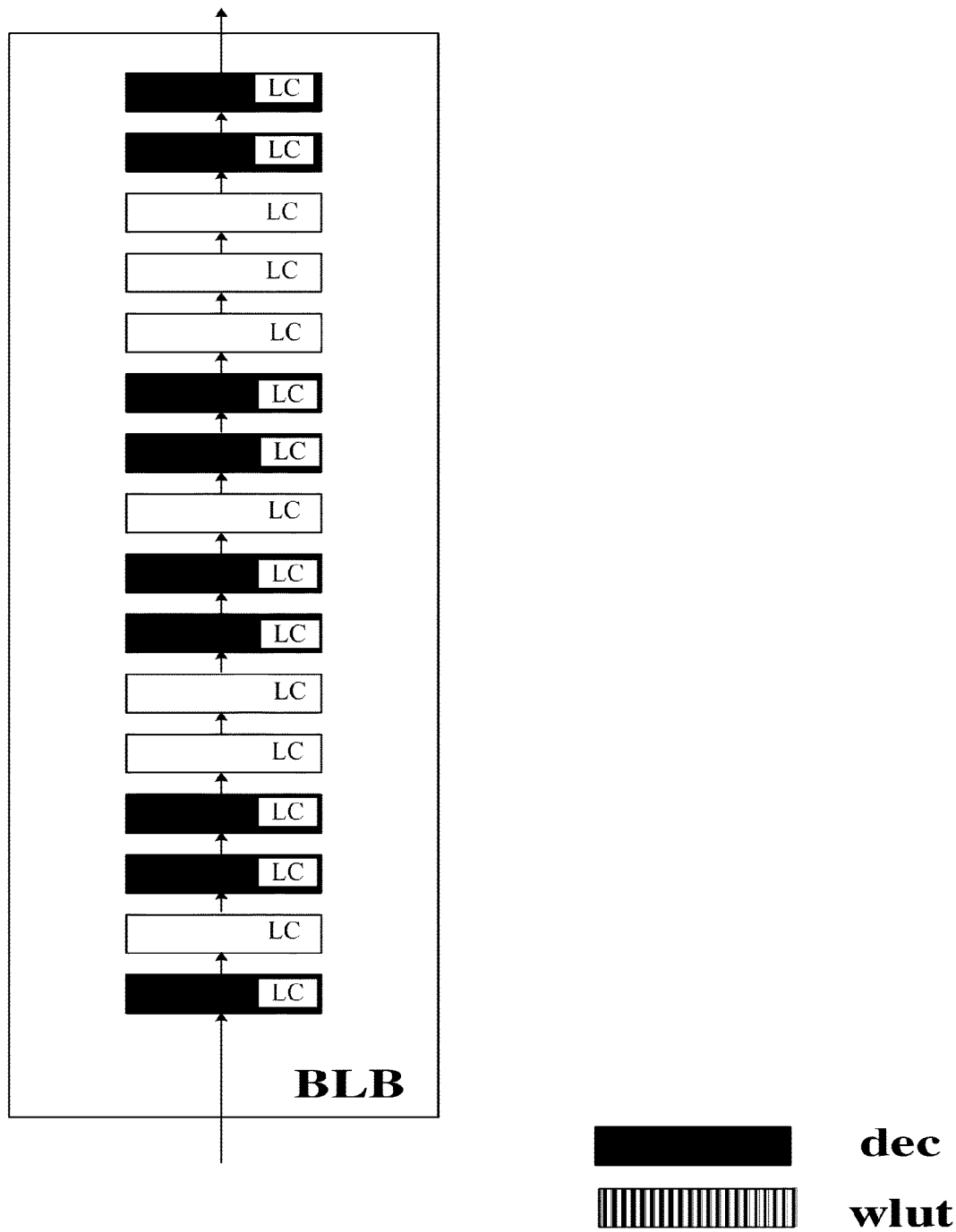
FIG. 14 illustrates placement of the LCs used to form 32-bit decoder within a basic logic block.

FIG. 14 illustrates a placement pattern of the LCs used to form 32-bit decoder within a basic logic block. In FIG. 14, 4 LC pairs and a single LC used to form 32-bit decoder as shown in FIG. 13 are placed respectively in first-second, sixth-seventh, ninth-tenth, $13^{th}$-$14^{th}$, and $16^{th}$ LC positions of a BLB. It will be appreciated that these LC pairs and LC may be placed in the BLB randomly due to the flexible placement requirement of buddy logics. There may be thousands of different ways of placement to place the 32-bit decoder within a BLB.

Figure 15:
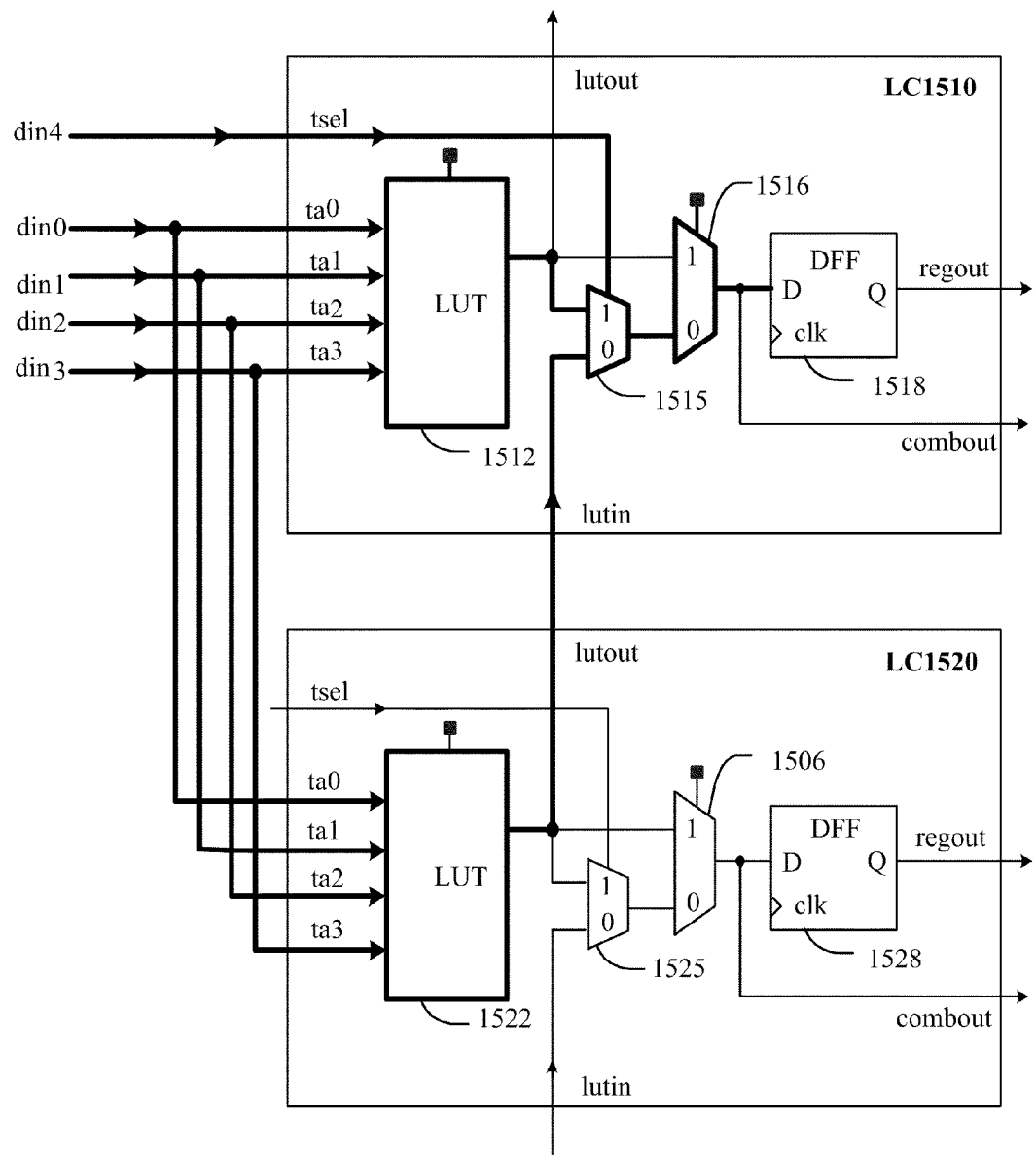
FIG. 15 illustrates how to build a LUT5 from two LCs using buddy logic with 2-to-1 mux.

FIG. 15 illustrates how to build a LUT5 from two LCs using buddy logic with 2-to-1 mux. As shown in FIG. 15, LC 1510 and LC 1520 have the same structure as LC 900 in FIG. 9. The LUT5 has five input terminals, din0, din1, din2, din3 and din4. Signals from din[3:0] are fed to both LUT 1512 of LC 1510 and LUT 1522 of LC 1520 at their respective input terminals ta0, ta1, ta2 and ta3; and, din4 is connected to input terminal tsel of LC 1510. Input terminal lutin of LC 1510 is connected to output terminal lutout of LC 1520. The select terminal of multiplexer 1516 is programmed to pass output signal of multiplexer 1515 through.

In operation, multiplexer 1515 functions to multiplex output of LUT 1512 and output of LUT 1522. By appropriately programming LUT 1512 and LUT 1522, the logic circuit of FIG. 15 can implement a LUT5 using only two logic cells with a delay that is slightly larger than that of a LUT4. This compares favorably with the traditional approach of building a LUT5 out of 3 LUT4 with two levels of LUT delay plus a slower general interconnect delay.

Figure 16:
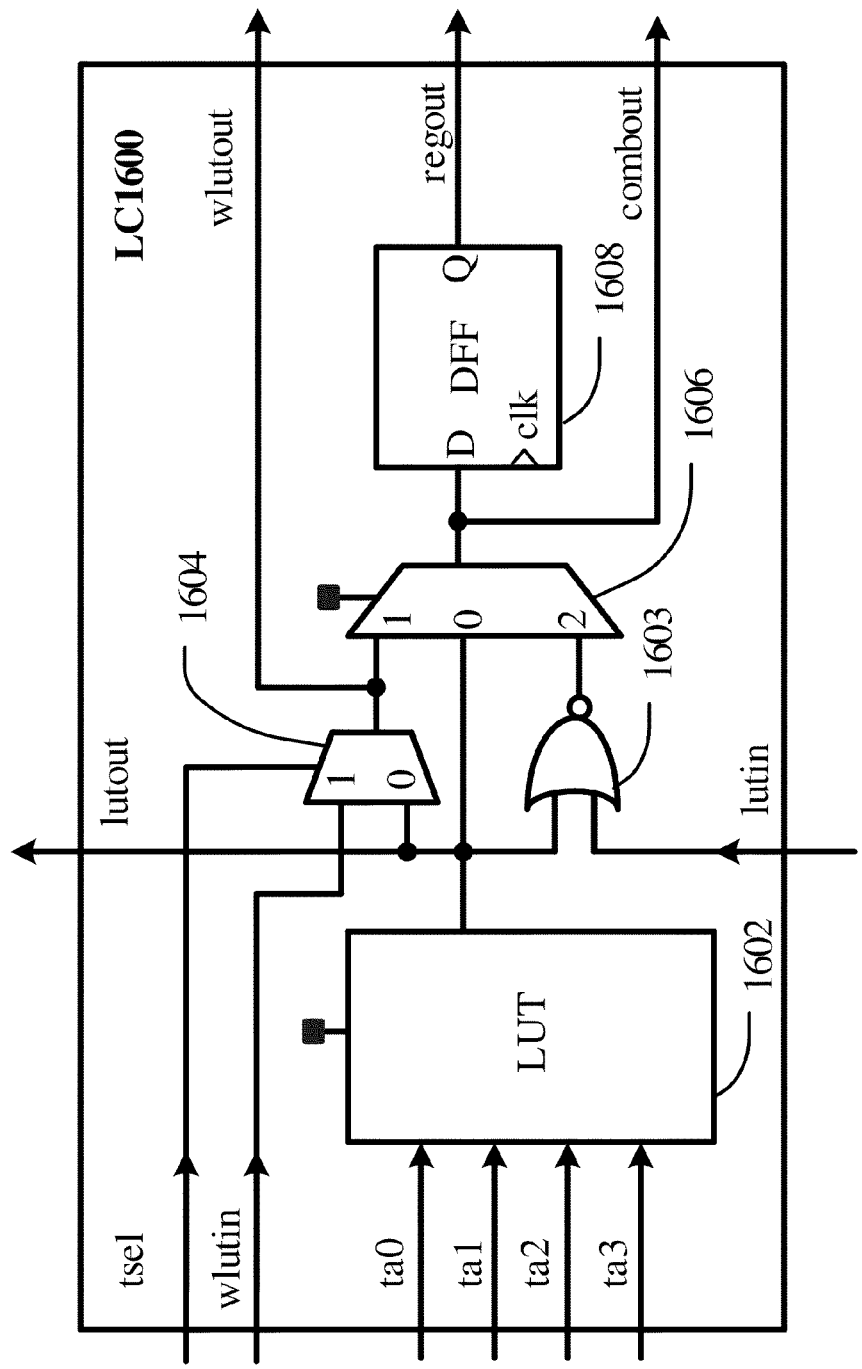
FIG. 16 illustrates a logic cell according to a fifth embodiment of the present invention.

FIG. 16 illustrates a logic cell according to a fifth embodiment of the present invention.

LC 1600 as shown in FIG. 16 differs from LC 200 in FIG. 2 in that it further comprises a NOR gate 1603 having two input terminals and an output terminal; an input terminal lutin and an output terminal lutout; and, the multiplexer 1606 has three input terminals, i.e., input terminals 0, 1, and 2, instead of two input terminals. One of the input terminals of NOR gate 1603 is connected to output terminal of LUT 1602 and the other one is connected to input terminal lutin of the LC 1600. The output terminal of NOR gate 1603 is connected to input terminal 2 of multiplexer 1606. Input terminal 0 of multiplexer 1606 is connected to the output terminal of LUT 1602 and input terminal 1 of multiplexer 1606 is connected to output terminal of multiplexer 1604.

As mentioned above, a plurality of LCs 1600 having multiplexer 1604 may constitute a WLUT chain while two LCs 1600 having NOR gate 1603 may constitute a buddy logic. Therefore, a combination of buddy logic and WLUT chain may be formed by a plurality of LCs 1600.

Figure 17:
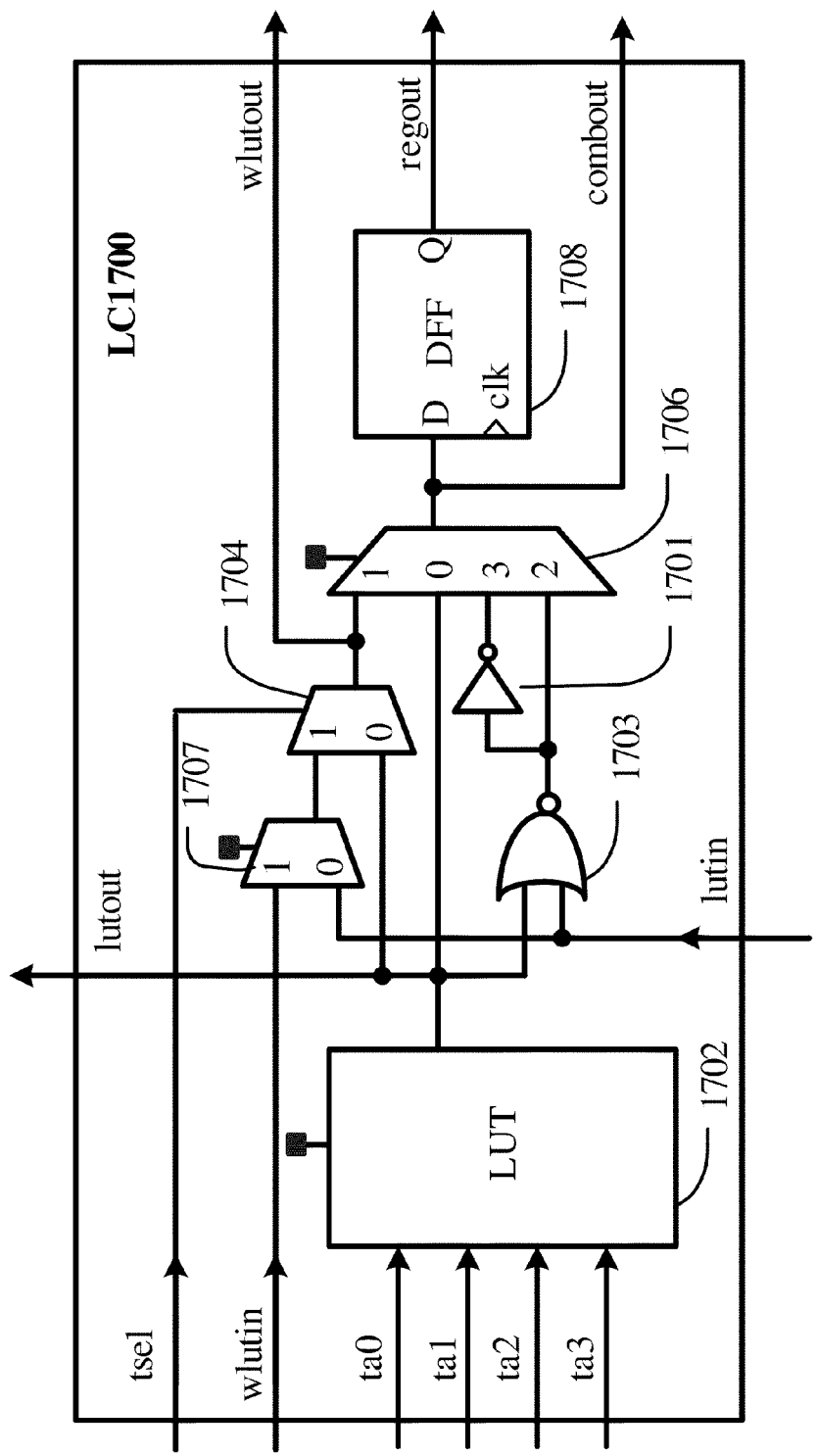
FIG. 17 illustrates a logic cell according to a sixth embodiment of the present invention.

FIG. 17 illustrates a logic cell according to a sixth embodiment of the present invention. LC 1700 in FIG. 17 differs from LC 1600 of FIG. 16 mainly in that it replaces multiplexer 1604 with a multiplexer 1707 and a multiplexer 1704. Further, LC 1700 is shown to have a NOT gate 1701.

Multiplexer 1707 has two input terminals, input terminal 0 and input terminal 1; an output terminal; and, a select terminal. Input terminal 0 of multiplexer 1707 is connected to the input terminal lutin of the LC, which may receive an output signal from the LUT of another LC downward. Input terminal 1 of multiplexer 1707 is connected to the input terminal wlutin of the LC, which may receive an output from the LUT of another LC to the left. Multiplexer 1707 multiplexes the two input signals, and the select terminal decides which of the two input signals to be selected and passed on.

Multiplexer 1704 has also two input terminals, input terminal 0 and input terminal 1; an output terminal; and, a select terminal. The input terminal 1 of multiplexer 1704 is connected to the output terminal of multiplexer 1707; input terminal 0 of multiplexer 1704 is connected to the output terminal of LUT 1702; the input terminal tsel is connected to the select terminal of multiplexer 1704 and decide which of the two inputs will be selected and passed on. The output terminal of multiplexer 1704 is connected to input terminal 1 of multiplexer 1706.

In operation, multiplexer 1707 may receive via input terminal wlutin output of the LUT of another LC to the left and pass it on to multiplexer 1704, which receive also the output of LUT 1702. Multiplexer 1704 may select one of them and pass it on to output terminal wlutout of the LC. Therefore, a plurality of LCs 1700 having multiplexer 1707 and multiplexer 1704 may constitute a WLUT chain.

Further, multiplexer 1707 may receive at its input terminal 0 output of the LUT of another LC downwards and pass it on to multiplexer 1704, which receives also output of LUT 1702. Therefore, two LCs having multiplexer 1707 and multiplexer 1704 may constitute a buddy logic.

Further, two LCs having the NOR gate 1703 constitutes another buddy logic. The NOT gate 1701 has its input terminal connected to output terminal of NOR gate 1703 and its output terminal connected to input 3 of multiplexer 1706. Those skilled in the art will recognize that by this kind of arrangement, LC1700 may implement all of the four algorithms, NOR, OR, NAND, AND.

Figure 18:
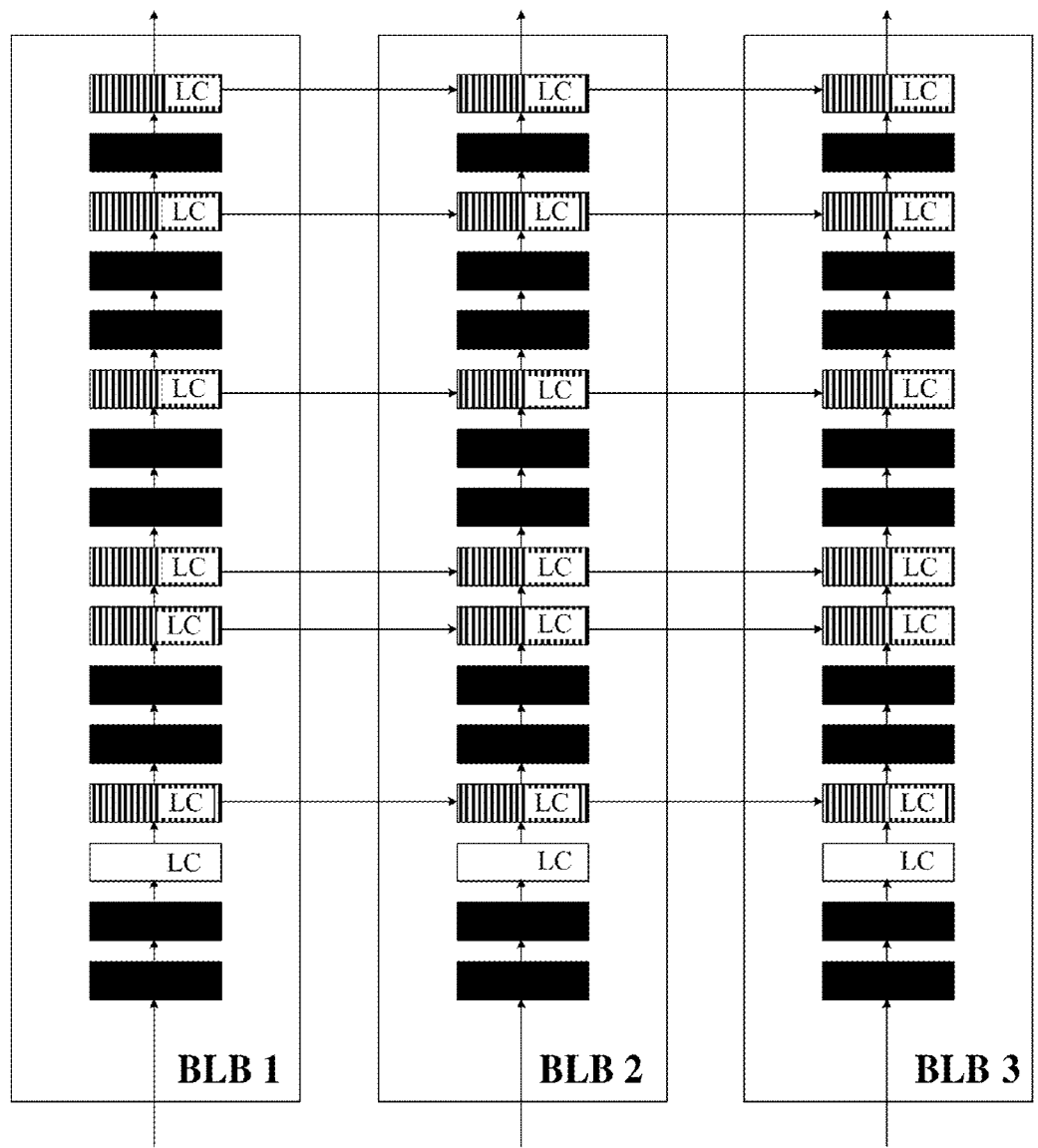
FIG. 18 illustrates a hybrid placement pattern of buddy LCs used to form 32-bit decoder and WLUT chains within basic logic blocks.

FIG. 18 illustrates a hybrid placement pattern of buddy LCs used to form 32-bit decoder and WLUT chains within basic logic blocks. As shown in FIG. 18, there are 3 BLBs, each having 16 LCs. LCs having vertical line pattern are used to form WLUT chains while LCs having grid pattern are used to form a 32-bit decoder. Due to the fact that buddy logics are formed in short 'chain', the buddy logics may be flexibly placed among LCs unoccupied by WLUT chains. Therefore, integrated circuits with great flexibility will be achieved.

The LCs and integrated circuits formed therefrom according to the present invention may not be limited to FPGA circuit, but also applicable to any integrated circuit embedded with FPGA, such as CSoC and PSoC. Further, the LCs and integrated circuits formed therefrom may be interconnected with various interconnect networks.

While there has been described in connection with the preferred embodiments of the invention, it will be obvious to those skilled in the art that various changes and modifications may be made therein without departing from the invention. For example, although the LUTs as mentioned above have been shown to have 4 input terminals, they may have any other number of input terminals. In addition, D flip-flops may be replaced with any other kind of flip-flops.

It is aimed, therefore, to cover in the appended claims all such changes and modifications as fall within the true spirit and scope of the invention, which is defined by the metes and bounds of the appended claims.

What is claimed is:

1. An integrated circuit having at least a first logic cell and a second logic cell, the first logic cell (800, 900) comprising:
   a LUT (802, 902) having a LUT output terminal, a circuit (803, 905) having a first circuit input terminal and a second circuit input terminal, and a first input terminal (lutin); wherein the LUT output terminal of the LUT is connected to the first circuit input terminal and the first input terminal is connected to the second circuit input terminal;
   the second logic cell (800, 900) comprising: a LUT (802, 902) having a LUT output terminal, and a first output terminal (lutout), the first output terminal is connected to the LUT output terminal;
   the first output terminal of the second logic cell is connected to the first input terminal of the first logic cell, thereby a buddy logic is formed; and
   a third logic cell (1210), said third logic cell comprising a first output terminal (dlutout) and a LUT having a LUT output terminal; within the third logic cell, said LUT output terminal is connected to the first output terminal; the first logic cell (1220) has a second input terminal (ulutin), the circuit has a third circuit input terminal, which is connected to the second input terminal of the first logic cell; the second input terminal of the first logic cell is connected to the first output terminal of the third logic cell.

2. An integrated circuit as claimed in claim 1, wherein the first logic cell (1120) has a first output terminal (dlutout), which is connected to circuit output terminal of the circuit (1123) of the first logic cell; the second logic cell (1130) has a first input terminal (ulutin), which is connected to the first output terminal of the first logic cell so as to feed the output of the circuit of the first logic cell into the second logic cell.

3. An integrated circuit as claimed in claim 1, wherein the integrated circuit comprises a FPGA.

4. An integrated circuit as claimed in claim 1, wherein said circuit is chosen from the group including an AND gate, NAND gate, OR gate, NOR gate and XOR gate.

5. An integrated circuit as claimed in claim 4, wherein the first logic cell includes a NOT gate, the input terminal of which is connected to output terminal of the circuit.

6. An integrated circuit as claimed in claim 1, wherein said circuit comprises a multiplexer or multiplexers.

7. The integrated circuit as claimed in claim 6, wherein said first logic cell has a second input terminal and a plurality of third input terminals, which are respectively connected to input terminals of the LUT of the first logic cell; said second logic cell has a plurality of first input terminals, which are respectively connected to input terminals of the LUT of the second logic cell; the plurality of third input terminals of the first logic cell and the plurality of first input terminals are coupled respectively with each other; said multiplexer or multiplexers have a select terminal, which is connected to the second input terminal of the first logic cell; thereby a wider LUT is formed.

8. The integrated circuit as claimed in claim 1, wherein the first logic cell comprises a multiplexer (803) having a first multiplexer input terminal, a second multiplexer input terminal, a multiplexer select terminal and a multiplexer output terminal; the first multiplexer input terminal of the multiplexer is connected to the circuit output terminal of the circuit and the second multiplexer input terminal of the multiplexer is connected to the output terminal of the LUT, the output terminal of the second multiplexer is coupled to a second output terminal (regout, combout) of the first logic cell; wherein the multiplexer select terminal is driven by a configuration memory cell, which may be programmed to let the multiplexer pass on the signal at its first or second multiplexer input.

9. The integrated circuit as claimed in claim 8, wherein the first logic cell comprises a flipflop having a flipflop input terminal and a flipflop output terminal, within the first logic cell, said coupling of the second output terminal of the logic cell to the circuit output terminal of the first circuit is achieved by connecting the flipflop input terminal of the flipflop to the output terminal of the circuit and connecting the flipflop output terminal of the flipflop to the second output terminal.

* * * * *